United States Patent [19]

Shelpuk

[11] 4,153,476
[45] May 8, 1979

[54] DOUBLE-SIDED SOLAR CELL PACKAGE

[76] Inventors: Robert A. Frosch, Administrator of the National Aeronautics and Space Administration, with respect to an invention of Benjamin Shelpuk, Evergreen, Colo.

[21] Appl. No.: 891,243

[22] Filed: Mar. 29, 1978

[51] Int. Cl.² .......................................... H01L 31/06
[52] U.S. Cl. ........................... 136/89 PC; 136/89 SJ; 136/89 CC; 136/89 CA
[58] Field of Search ........... 136/89 PC, 89 CC, 89 H, 136/89 SJ, 89 CA

[56] References Cited

U.S. PATENT DOCUMENTS

| | | | |
|---|---|---|---|
| 3,278,811 | 10/1966 | Mori | 136/89 X |
| 4,000,734 | 1/1977 | Matlock et al. | 126/270 |
| 4,045,246 | 8/1977 | Mlavsky et al. | 136/89 PC |
| 4,052,228 | 10/1977 | Russell | 136/89 PC |
| 4,056,404 | 11/1977 | Garone et al. | 136/89 PC |
| 4,070,206 | 1/1978 | Kressel et al. | 136/89 TF |
| 4,078,944 | 3/1978 | Mlavsky | 136/89 H |

FOREIGN PATENT DOCUMENTS 2342559  10/1977  France ................... 136/89 PC

*Primary Examiner*—Aaron Weisstuch
*Attorney, Agent, or Firm*—Monte F. Mott; John R. Manning; Wilfred Grifka

[57] ABSTRACT

In a solar cell array of terrestrial use, an improved double-sided solar cell package consisting of a photovoltaic cell having a metallized P-contact strip and an N-contact grid provided on opposite faces of the cell, a transparent tubular body forming an enclosure for the cell, a pedestal supporting the cell from within the enclosure comprising an electrical conductor connected with the P-contact strip provided for each face of the cell, and a reflector having an elongated reflective surface disposed in substantially opposed relation with one face of the cell for redirecting light to impinge thereon whereby the cell is subjected to incident radiation at each of its opposite faces.

10 Claims, 9 Drawing Figures

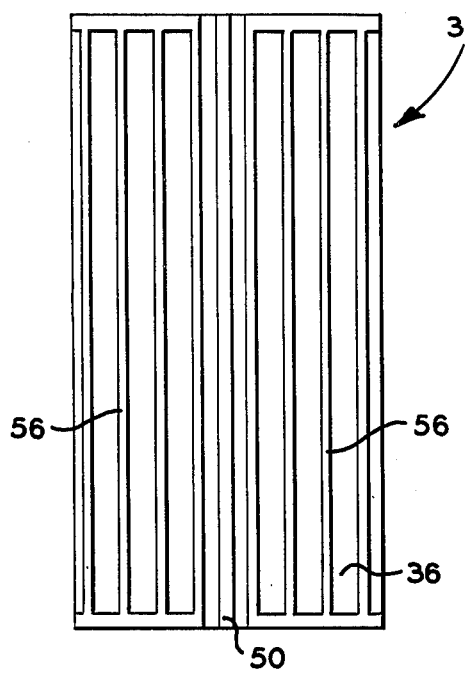
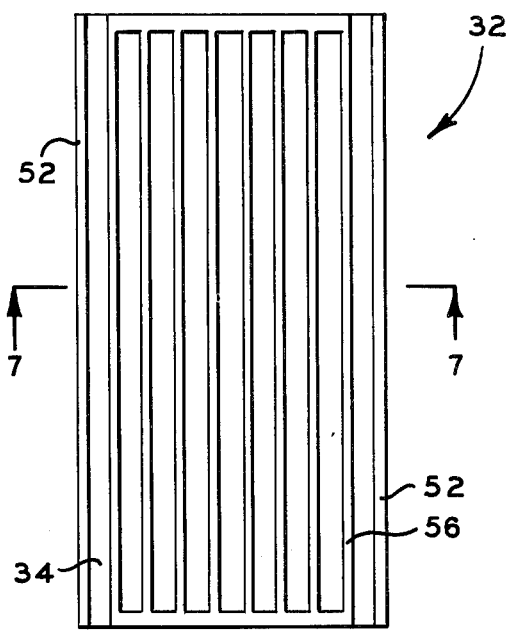
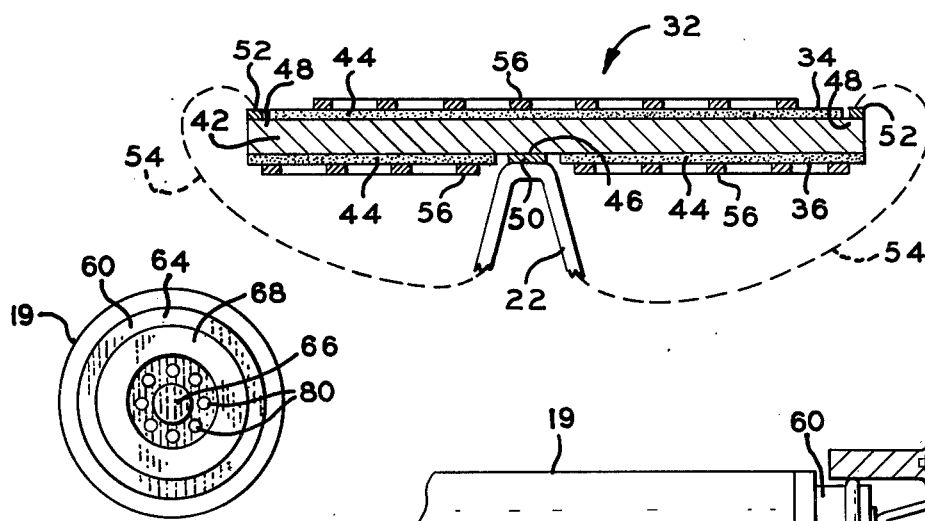
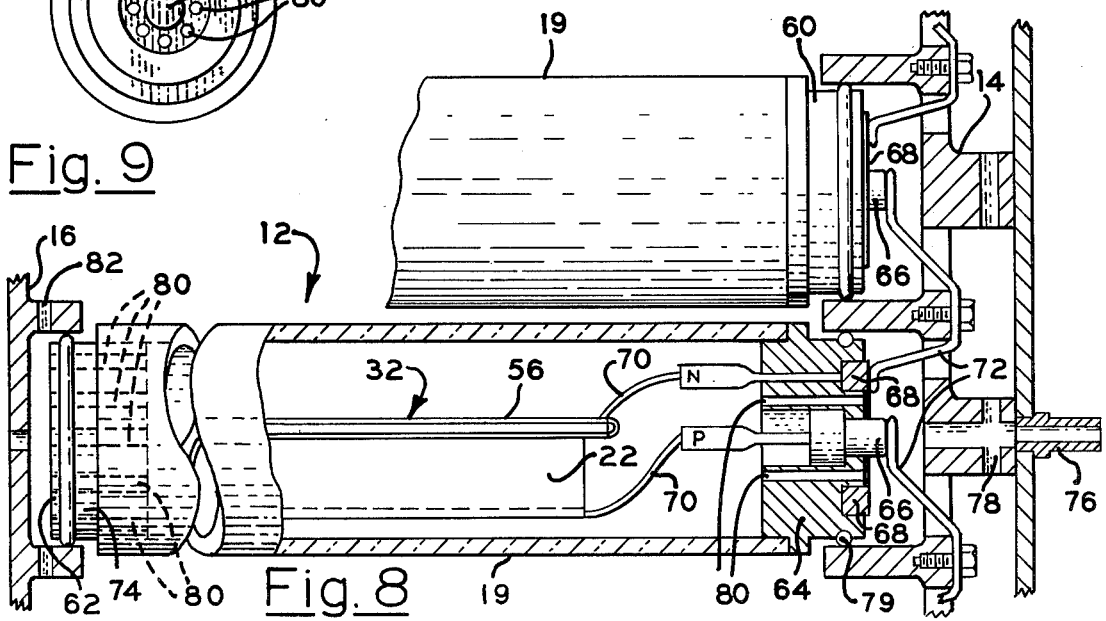

DOUBLE-SIDED SOLAR CELL PACKAGE

BACKGROUND OF THE INVENTION

1. Field of the Invention

The invention generally relates to a solar cell package and more particularly to a solar cell package including an improved double-sided solar cell mounted within a tubular transparent enclosure and having associated therewith a surface for redirecting incident rays to impinge on at least one side surface of the solar cell, whereby both sides of the solar cell is illuminated.

2. Description of the Prior Art

The prior art, of course, is replete with photovoltaic devices adapted to induce a current flow through an electrical circuit in response to incident solar radiation. While such devices are frequently employed in a celestial space environment the costs thereof attending usage in a terrestrial environment severely limits their utility. Substantial attention now is being given to the reduction of costs attending the use of photovoltaic devices, hereinafter referred to as solar cells, in a terrestrial environment so that the advantages thereof may be more fully appreciated.

Unlike most semiconductor devices, conventional solar cells have a significant value resulting solely from the material used in their fabrication, as opposed to the value added thereto as a consequence of fabrication. Consequently, cost reduction, and therefore increased usage of solar cells can be realized simply by reducing the quantity of silicon employed therein, once the processing steps for growing silicon cells are automated.

Currently, there are indications that single crystal silicon wafers cannot be fabricated and handled for minimum costs at thicknesses indicated suitable for adequate performance levels, such as four mills or less. Currently, the most practical thickness is in the range of for six-to-eight mills, or the thickness of two thin-type solar cells arranged in back-to-back contact. Therefore, in order to realize maximum cost effectiveness, fabrication and handling of solar cells having a thickness twice the thickness for adequate performance levels is desirable. However, from a cost effectiveness standpoint it is still necessary to make effective use of the total quantity of material included in the solar cells in order to realize cost savings.

Moreover, solar cells and similar devices usually are protected from the deleterious effects of terrestrial environments through use of glass sheets provided in an hermetically sealing relation therewith. The resulting device, while capable of withstanding the effects of wind, snow, rain, hail, blowing sand and the like, generally is considered to be impractical for many uses because of its cost in terms of time and material devoted to the fabrication thereof.

It generally is recognized that from a cost effectiveness standpoint it is cheaper to utilize a transparent or glass enclosure of a tubular configuration for encasing solar cells, since less material is used per unit area and glass tubes can be drawn as cheaply as being fabricated in any other structural form. However, one significant problem associated with the use of tubular enclosures or solar cells is that difficulty often is encountered in the rejection of excess heat from the solar cells.

In view of the foregoing, it should readily be apparent that there currently exists a need for a simplified solar cell package which is economic to fabricate and practical to employ in a terrestrial space environment.

It is therefore the general purpose of the instant invention to provide in a solar cell array for terrestrial use an economic and improved solar cell through which an increase in the usage of solar cells is realized in terrestrial environments.

OBJECTS AND SUMMARY OF THE INVENTION

It is therefore the general purpose of the instant invention to provide an economic and improved solar cell package for use in a terrestrial environment.

It is another object to provide an improved double-sided solar cell package which is both economic to fabricate and operates with increased efficiency.

It is another object to provide for use in a solar cell package a double-sided silicon solar cell having a thickness substantially equal to twice the thickness normally accepted to be adequate for achieving solar cell performance at acceptable levels.

It is another object to provide an improved solar cell package having a protective enclosure which is economic to fabricate, simple to employ, and possesses a capability for rejecting excess heat.

It is another object to provide for use in a terrestrial environment an improved solar cell package including a doublesided solar cell mounted in a tubular enclosure formed of a transparent material having associated therewith a reflector for directing incident solar energy to impinge against both faces of the cell.

Another object is to provide an improved solar cell package which is particularly useful in a terrestrial environment although not necessarily restricted in use thereto, since the improved solar cell package which embodies the principles of the instant invention may be equally useful when installed aboard spacecraft and the like.

These and other objects and advantages are achieved through the use of a solar cell package including a transparent enclosure of a tubular configuration having disposed therein a double-sided solar cell mounted on a pedestal formed of conductive material and associated with reflectors configured to direct incident solar energy to impinge on at least one of the faces of the solar cell, whereby both surfaces are simultaneously illuminated, as will hereinafter become more readily apparent by reference to the following description and claims in light of the accompanying drawings.

BRIEF DESCRIPTION OF THE DRAWINGS

FIG. 4 is a cross sectional view of a pair of solar cell packages taken generally along line 4—4 of FIG. 2, but on an enlarged scale.

FIG. 5 is a bottom plan view of a single solar cell included within one of the solar cell packages shown in FIGS. 3 and 4, but, for the sake of clarity, removed from its pedestal.

FIG. 6 is a top plan view of one of the solar cells shown in FIGS. 3 and 4.

FIG. 7 is a cross sectional view taken generally along line 7—7 of FIG. 6 illustrating the solar cells cross section.

FIG. 8 is a fragmented view illustrating one manner in which the solar cell packages are connected.

FIG. 9 is a view of one end of one of the solar cell packages, illustrating the electrical connections provided for connecting the solar cell package within an electrical circuit, and openings provided therein for accommodating forced-air cooling of the package.

DESCRIPTION OF THE PREFERRED EMBODIMENT

Figure 1:
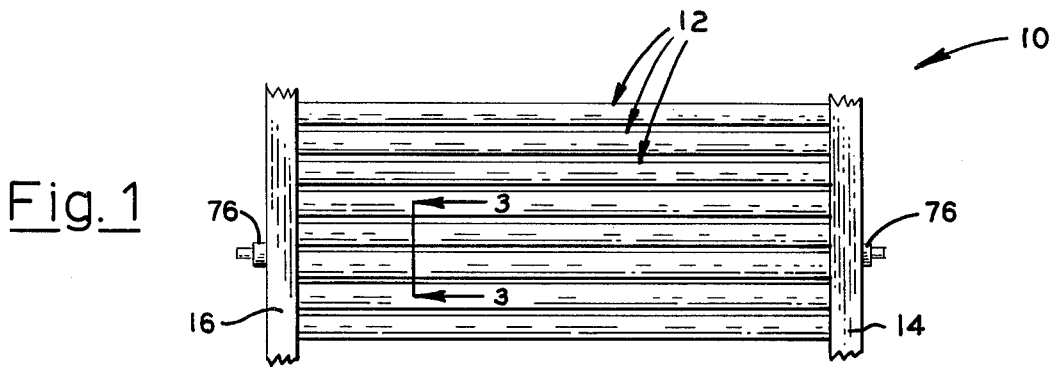
FIG. 1 is a top plan view of a solar cell array which embodies the principles of the instant invention.

Referring now to the drawings, wherein like reference characters designate like or corresponding parts throughout the several views, there is depicted in FIG. 1, a solar cell array, generally designated 10, which comprises the principles of the instant invention. As shown in FIG. 1 the solar cell array 10 includes a plurality of solar cell packages, each being generally designated 12, arranged in side-by-side parallelism and supported at each of their opposite ends by manifolds designated 14 and 16. It will, of course, be appreciated that the solar cell packages 12 include housings, of alternate configurations designated 18 and 19, of a suitable length, while the manifolds 14 and 16 preferably support the housings for rotation in a manner which accommodates a tracking of the path of the sun across the sky, as will hereinafter become more readily apparent.

Figure 3:
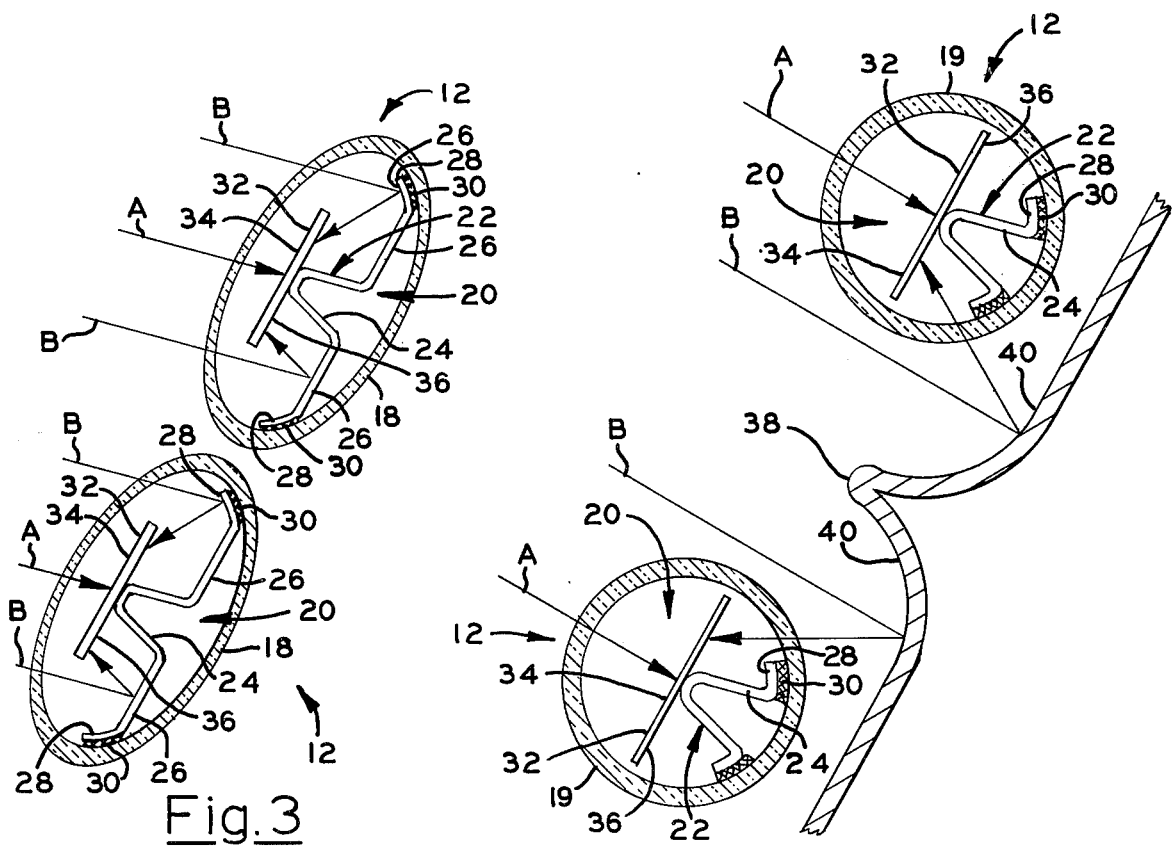
FIG. 3 is a cross sectional view of a pair of adjacent solar cell packages, taken generally along line 3—3 of FIG. 1, but on an enlarged scale.

Referring now to FIG. 3, it can be seen that each solar cell package 12 includes a substantially transparent housing 18 comprising an elongated tubular body having a non-circular cross sectional configuration. As a matter of interest, the housing 18 is so dimensioned in cross section as to be provided with a major diameter substantially greater than its normally minor diameter for thus imparting thereto an elliptical configuration. Within the housing 18 there is mounted a solar cell assembly, generally designated 20, the purpose of which is to convert incident solar radiation to electrical energy. The solar radiation, of course, is afforded passage through the housing 18, due to its transparency.

The solar cell assembly 20 includes a pedestal 22 having a body 24 terminating in a pair of laterally extended, longitudinal plates 26. Each of the plates, in turn, terminates in a deflected footing 28 configured to engage the internal surface of the housing for supporting the body 24. Each footing 28 preferably is of a cross sectional configuration substantially conforming to the cross sectional configuration of the surface area of contact, not designated, provided within the housing 18. As a practical matter, the pedestal 22 is fabricated from a conductive material, such as copper foil, and is bonded to the internal surface of the housing 18 employing a layer 30 of compliant adhesive. While the particular adhesive employed is deemed to be a matter of convenience only, a silicone adhesive serves quite satisfactorily for this purpose. While the adhesive employed is varied as desired, the adhesive employed must be capable of conducting heat, whereby excessive heat is afforded a discharge path from the pedestal 22 to the housing 18, in order to maximize heat rejection through the housing wall. Thus the wall of the housing becomes a component of a heat transfer path.

Mounted on the apex of the pedestal 22 is a double-sided solar cell 32, the purpose of which is to convert solar radiation to electrical energy at each of its opposite faces simultaneously. As best illustrated in FIGS. 3 and 4, rays A of radiation pass through the transparent wall of the housing 18 and strike the upper surface, designated 34, of the solar cell 32, while the rays B of radiation are reflected to strike the lower surface 36 of the solar cell 32.

As illustrated in FIGS. 1 and 3, the surfaces of the plates 26 are polished so that the rays B are reflected toward the surface 36 of the solar cell. The surface of the plates 26 are, where so desired, coated in a manner which establishes therefor a highly reflective surface for purposes of redirecting the rays B to impinge on the lower surface 36 of the solar cell 32.

Figure 2:
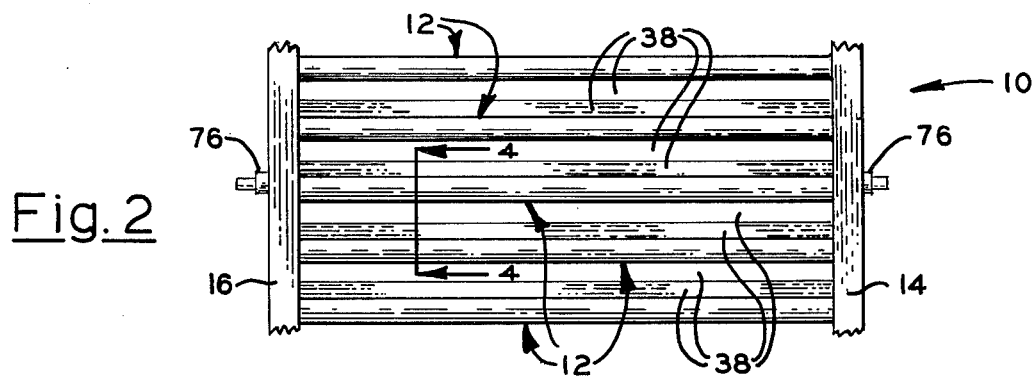
FIG. 2 is a modification of the array shown in FIG. 1.

As best shown in FIGS. 2 and 4, the housing, where desired, may be of a circular cross sectional configuration, which is employed in instances where non-circular glass tubing tends to increase cost and low-cost requirements which are of utmost concern.

As shown, transparent housing 19 is of a substantially circular cross sectional configuration, while the double-sided solar cell 32 is of a width substantially equal to the internal diameter of the housing. The configuration of the pedestal 22 also is of a modified configuration, in that the longitudinal plates 26 are foreshortened in width, with the footing 28 being projected from the body 24 and bonded to the internal surface of the housing.

Since the longitudinal plates 26 are, in effect, deleted in the embodiment shown in FIG. 4, it is desirable to provide for the solar cell package illustrated in FIG. 4 an external reflector 38 having a surface 40 so configured as to reflect rays B of solar energy to impinge against the lower surfaces 36 of the solar cells 32 while rays A strike the upper surfaces 34 in the same manner in which the rays A strike the surfaces 34 of the solar cells 32 illustrated in FIG. 3. Consequently, the solar cell packages 12 illustrated in FIGS. 1 and 2 function in substantially the same way with the exception that solar cell packages 12 having housings 18, FIG. 3, are provided with internal reflective surfaces 26 while the solar cell packages 12 having housings 19 of circular cross sectional configurations, FIG. 4, are provided with external reflecting surfaces 40.

Referring now to FIGS. 5, 6 and 7, wherein the doublesided solar cell 32 is illustrated with more particularity, but not to scale for the sake of clarity, it can be seen that the solar cells 32 include a P silicon wafer 42, into the opposite faces of which is diffused an N silicon layer 44. As a practical matter, the P silicon wafer 42 is of a thickness of approximately six-to-eight mills. This thickness is substantially twice the thickness required for achieving adequate performance levels for a single-sided solar cell. In order to make contact with the high resistivity wafer at the center of the cell, without employing an excessively complex grid pattern, calculations indicate that if low resistivity of approximately 0.2 ohms per centimeter material is used, contact spacing of one centimeter is adequate. Contact spacing of the diffused layer or N slicon layer 44 is 0.25 centimeters or less. The pattern illustrated in FIGS. 5 through 7 is deemed adequate for providing a contact arrangement which permits collection of photon generated electrons from each of the opposite sides of the double-sided solar cell 32.

In order to provide the contacts, after the layer 44 is diffused into all exposed surfaces of the wafer 42, etching is employed for purposes of removing the N silicon layer 44 along a central zone 46 of the lower surface 36 of the solar cell 32 while edge zones 48 of the wafer are exposed along the opposite edges of the upper surface 34 of the cell 32. The zones 46 and 48 are then metallized to provide three contact stripes designated 50 and 52. The contact stripe 50 is then bonded to the body 24 of the pedestal 22 whereby an electrical contact is established between the pedestal 22 and the contact stripe 50.

By connecting the three contact stripes the electrical resistance due to the resistivity of the wafer is rendered acceptable. Such connection is effected by bonding a lead 54 to each of the contact stripes 52 and to the pedestal 22 in the manner generally indicated in FIG. 7. In practice, a contact grid 56 of known design, FIGS. 5 and 6, is bonded to the layer 44 excepting, of course, those areas at which the junction formed between the N silicon layer 44 and the P silicon wafer has been etched through for purposes of accommodating current collection. The solar cells 32 are, where desired, connected in series by leads connected in a suitable manner between each N silicon layer 44 and an adjacent P silicon wafer 42. In such instances, the leads employed are formed of a heat conductive material and are bonded to the housing for establishing heat transfer paths additional to the paths, aforementioned, established by the pedestal 22.

As best illustrated in FIG. 8, each solar cell package 12 includes a head 60 and a tail 62. Within the head 60 there is provided a plug 64 formed of a suitable insulating material, such as a ceramic or the like, which serves as a closure for a housing 18, or 19 as the case may be, as well as a support for coupling the package with the manifold 14. Mounted in each of the plugs 64 is a button contact 66 and an annular contact 68. The contact 68 is embedded in the plug 64 in concentric relation with the button contact 66. A pair of leads 70 serve to connect the contacts 66 and 68 to the pedestal 22 and to grid 56, respectively. Thus the double-sided solar cell 32 is provided with simple contacts through which connection within a power support circuit, not designated, is afforded.

As illustrated, the manifold 14 is provided with a plurality of spring finger contacts 72, the purpose of which is to connect each ring contact 68 in circuit series with an adjacent button contact 66 for purposes of connecting the solar cell packages 12 of the array 10 in series. The spring fingers, of course, also accommodate angular displacement of the housings for the solar cell packages, whereby tracking of the sun across the sky is facilitated. Such rotation may be achieved manually or, preferably, through a use of a drive unit, not shown.

Located at the tail end 62 of each of the housings 18 and 19, as the case may be, there is a plug 74 the primary purpose of which is to serve as a closure for the housing, as well as to serve as a coupling member for uniting the solar cell package 12 with the manifold 16.

In some instances dissipation of heat must be enhanced even though the pedestals 22 are connected to circuit leads attached to the housing which serve to conduct heat to said housing of the solar cell package. To achieve this, the manifold 14 is provided with a fitting 76 adapted to be connected with a source of coolant under pressure, not shown, while a network of interconnected manifold passageways 78 are provided for conducting a stream of fluid coolant, such as air, throughout the manifold. In such instances, an O ring 79 is mounted in circumscribing relation with each of the plugs 64 and 74 for purposes of establishing a substantial hermetic seal between the plugs and the manifold whereby a plenum chamber, not designated, is provided at each of the appropriate ends of the packages, as illustrated in FIG. 8. A series of bores 80 extend through the plugs 64 and 74 for accommodating passage of coolant through the plugs. In order to facilitate passage of a coolant through the solar cell packages 12, the manifold 16 also is provided with a plurality of interconnected passageways 82 which conduct coolant discharged from the packages 12 for subsequent disposal. Thus it is possible to maintain the double-sided solar cells 32 at acceptable levels of temperature.

OPERATION

It is believed that in view of the foregoing description of the invention its operation should be apparent. However, with a view to assuring a complete understanding thereof its operation will be reviewed briefly at this point.

With the solar cell array 10 fabricated in the manner hereinbefore described, it is prepared for use simply by positioning the array in a suitable location and orienting the individual solar cell package to receive incident radiation. Of course, where desired, the packages may be connected with a tracking system, not shown, which includes a drive mechanism for imparting rotary motion to the solar cell packages 12, for purposes of tracking the sun across the sky.

With the individual solar cell packages mounted in a coupled relation in a supported relationship with the manifolds 14 and 16, rays A of incident radiation pass through the transparent wall of the housings to impinge upon the upper surfaces 34 of the double-sided solar cells 32, while rays B are reflected to impinge against the lower surfaces of the solar cells. Where the housing 18, which is of a substantially eliptical cross sectional configuration, is employed the surfaces of the longitudinal plates 26 function as reflectors for redirecting the rays B toward the surfaces 36 of the cells 32. However, where the housing 19, which is of a substantially circular cross sectional configuration, is employed, the reflecting surfaces 40 of the reflector 38 serve to redirect the rays B causing these rays to pass through the transparent housing and impinge on the lower surface 36 of the solar cell 32.

As a consequence of the radiaton incident upon the cells 32 a photovoltaic current is established and caused to flow through a voltage pick-off circuit including the contacts 66 and 68 and the spring finger 72. This current is then conducted from the array 10 employing a suitable electrical circuit, not shown.

In order to achieve a desired cooling of the cells 32 air, or other suitable coolant, is introduced into the manifold 14, under pressure, through the fitting 76 and caused to flow through the bores 80 and, consequently, the individual solar cell packages 12. Thus excessive heat is removed by convection from the solar cell packages 12.

In view of the foregoing, it should readily be apparent that the solar cell packages which embody the principles of the instant invention provide a practical solution to various problems encountered when employing photovoltaic cells in a terrestrial environment.

What I claim is:

1. In a solar cell array for terrestrial use, an improved double-sided solar cell package comprising:
   A. a photovoltaic cell having a metallized P-contact stripe and an N-contact grid provided at each of the opposite faces thereof;
   B. a transparent tubular body forming an enclosure for said cell;
   C. a pedestal supporting said cell within the enclosure comprising an electrical conductor connected with the P-contact stripe provided for each face of the cell; and D. means for directing rays of light to impinge on each face of said cell.

2. The array of claim 1 wherein the photovoltaic cell comprises a silicon cell having a P-contact stripe extended along the center portion of one face of the cell and a pair of P-contact stripes extended along opposite side edges of the other face thereof, and means electrically connecting said one P-contact stripe with said pair of P-contact stripes.

3. The array of claim 2 wherein said pedestal is formed of electrically conductive material and is electrically connected to each of said P-contact stripes.

4. The array of claim 3 wherein said means for directing rays of light to impinge on each face of said cell includes means defining reflectors mounted on the internal surface of the tubular body having elongated reflective surfaces extended in substantially opposed relation with said one face of the cell.

5. The array of claim 3 wherein said means for directing rays of light to impinge on each face of said cell includes a reflector externally related to said tubular body having an elongated reflective surface extended in substantially opposed relation with said one face of the cell.

6. The array of claim 3 wherein said package comprises one of a plurality of similar packages arranged in adjacent parallelism and said array further comprises means for connecting said packages in electrical series including:

A. a closure plug mounted in one end of the tubular body forming the enclosure for each cell;

B. a first termination including a button contact mounted on said closure plug in substantial coaxial alignment with said tubular body and means for electrically connecting said first termination with said pedestal;

C. a second termination including a ring contact mounted on the closure plug in concentric relation with said button contact, and means for electrically connecting said second termination with said grid; and D. means including a spring finger contacting the first termination of each package and the second termination of an adjacent package.

7. The array of claim 6 further comprising means including at least one end support supporting each package for angular displacement about the longitudinal axis of the enclosure.

8. The array of claim 6 wherein said enclosure is of a circular cross sectional configuration.

9. The array of claim 6 wherein said enclosure is of a non-circular cross sectional configuration.

10. An improved photovoltaic cell comprising:

A. a planar body of semiconductor material of a substantially rectangular configuration including a first layer of P-type conductivity sandwiched between a second and a third layer of N-type conductivity, portions of the second layer having been removed along parallel edge regions of said body for exposing a pair of edge zones of said first layer, and a portion of the third layer having been removed along a central region of said body for exposing a central zone of said first layer;

B. means defining a pair of P-contact stripes extended along said pair of exposed edge zones of said first layer, and means defining a P-contact stripe extended along said exposed central zone of said first layer;

C. means defining on each N-layer an N-contact grid; and

D. means for supporting said cell comprising an electrically conductive pedestal disposed in juxtaposed relation with the central region of said body and connected with each of said p-contact stripes.

* * * * *